US012707717B2

(12) United States Patent
Kawashima et al.

(10) Patent No.: US 12,707,717 B2
(45) Date of Patent: Aug. 11, 2026

(54) DISPLAY APPARATUS AND ELECTRONIC DEVICE

(71) Applicant: SEMICONDUCTOR ENERGY LABORATORY CO., LTD., Atsugi (JP)

(72) Inventors: Susumu Kawashima, Atsugi (JP); Koji Kusunoki, Isehara (JP); Kazunori Watanabe, Tokyo (JP); Satoshi Yoshimoto, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 561 days.

(21) Appl. No.: 18/012,079

(22) PCT Filed: Jun. 28, 2021

(86) PCT No.: PCT/IB2021/055731

§ 371 (c)(1),
(2) Date: Dec. 21, 2022

(87) PCT Pub. No.: WO2022/009017

PCT Pub. Date: Jan. 13, 2022

(65) Prior Publication Data

US 2023/0255060 A1 Aug. 10, 2023

(30) Foreign Application Priority Data

Jul. 9, 2020 (JP) ................................. 2020-118406

(51) Int. Cl.
*H10K 59/40* (2023.01)
*H10D 86/40* (2025.01)
*H10K 59/121* (2023.01)

(52) U.S. Cl.
CPC ....... *H10D 86/423* (2025.01); *H10K 59/1213* (2023.02); *H10K 59/40* (2023.02)

(58) Field of Classification Search
None
See application file for complete search history.

(56) References Cited

U.S. PATENT DOCUMENTS 7,674,650 B2 3/2010 Akimoto et al.
7,732,819 B2 6/2010 Akimoto et al.
(Continued)

FOREIGN PATENT DOCUMENTS

CN 102654979 A 9/2012
CN 103258501 A 8/2013
(Continued)

OTHER PUBLICATIONS

Shim et al., "English Translation of KR20140082001A", 2014 (Year: 2014).*
(Continued)

*Primary Examiner* — Kretelia Graham
*Assistant Examiner* — Hamna Fathima Iqbal
(74) *Attorney, Agent, or Firm* — NIXON PEABODY LLP; Jeffrey L. Costellia

(57) ABSTRACT

A display apparatus suitable for wide-grayscale display is provided. The display apparatus includes, in a pixel, two driving transistors and a light-emitting device that are connected in series. One of the transistors is a p-channel transistor and the other of the transistors is an n-channel transistor, and switching therebetween is performed for driving. Such a configuration can inhibit the change in a gate-source voltage in display with a high grayscale level. In addition, the use of a transistor containing a metal oxide in
(Continued)

a channel formation region as the n-channel transistor enables an increase in display characteristics in display with a low grayscale level.

17 Claims, 14 Drawing Sheets

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,976,090 B2 | 3/2015 | Yamamoto et al. | |
| 9,099,562 B2 | 8/2015 | Akimoto et al. | |
| 9,129,927 B2 | 9/2015 | Gupta et al. | |
| 9,412,799 B2 | 8/2016 | Chang et al. | |
| 9,564,478 B2 | 2/2017 | Chang et al. | |
| 9,818,765 B2 | 11/2017 | Osawa et al. | |
| 10,096,622 B2 | 10/2018 | Gupta et al. | |
| 10,304,962 B2 | 5/2019 | Akimoto et al. | |
| 10,361,229 B2 | 7/2019 | Yamaguchi et al. | |
| 10,707,237 B2 | 7/2020 | Gupta et al. | |
| 10,741,588 B2 | 8/2020 | Gupta et al. | |
| 10,998,344 B2 | 5/2021 | Gupta et al. | |
| 11,107,845 B2 | 8/2021 | Okabe et al. | |
| 11,177,291 B2 | 11/2021 | Osawa et al. | |
| 11,380,798 B2 | 7/2022 | Takechi et al. | |
| 11,587,954 B2 | 2/2023 | Gupta et al. | |
| 2007/0072439 A1 | 3/2007 | Akimoto et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0239335 A1 | 9/2009 | Akimoto et al. | |
| 2009/0305461 A1 | 12/2009 | Akimoto et al. | |
| 2010/0136743 A1 | 6/2010 | Akimoto et al. | |
| 2011/0104851 A1 | 5/2011 | Akimoto et al. | |
| 2011/0117697 A1 | 5/2011 | Akimoto et al. | |
| 2011/0121290 A1* | 5/2011 | Akimoto | H10D 30/6757 257/E29.296 |
| 2011/0163311 A1 | 7/2011 | Akimoto et al. | |
| 2012/0223978 A1 | 9/2012 | Yamamoto et al. | |
| 2015/0028766 A1 | 1/2015 | Yang | |
| 2015/0053935 A1 | 2/2015 | Gupta et al. | |
| 2015/0054799 A1 | 2/2015 | Chang et al. | |
| 2015/0055047 A1 | 2/2015 | Chang et al. | |
| 2015/0055051 A1 | 2/2015 | Osawa et al. | |
| 2015/0243220 A1* | 8/2015 | Kim | H10D 86/471 345/215 |
| 2015/0340513 A1 | 11/2015 | Akimoto et al. | |
| 2017/0323906 A1 | 11/2017 | Yamaguchi et al. | |
| 2018/0033805 A1 | 2/2018 | Gupta et al. | |
| 2019/0006394 A1 | 1/2019 | Gupta et al. | |
| 2019/0051759 A1 | 2/2019 | Akimoto et al. | |
| 2019/0326444 A1 | 10/2019 | Akimoto et al. | |
| 2019/0392765 A1 | 12/2019 | Kuk et al. | |
| 2020/0075636 A1 | 3/2020 | Gupta et al. | |
| 2020/0335528 A1 | 10/2020 | Gupta et al. | |
| 2021/0225890 A1 | 7/2021 | Osawa et al. | |
| 2021/0335226 A1* | 10/2021 | Nie | G09G 3/3225 |
| 2022/0037374 A1 | 2/2022 | Gupta et al. | |
| 2022/0069137 A1 | 3/2022 | Akimoto et al. | |

FOREIGN PATENT DOCUMENTS

| | | | | |
|---|---|---|---|---|
| CN | 105612620 A | | 5/2016 | |
| CN | 107346083 A | | 11/2017 | |
| CN | 110476200 A | | 11/2019 | |
| EP | 3113226 A | | 1/2017 | |
| JP | 2007-096055 A | | 4/2007 | |
| JP | 2007-123861 A | | 5/2007 | |
| JP | 2012-185328 A | | 9/2012 | |
| JP | 2016-534390 | | 11/2016 | |
| JP | 2017-201665 A | | 11/2017 | |
| JP | 2020-205402 A | | 12/2020 | |
| KR | 20140082001 A | * | 7/2014 | H10K 59/123 |
| KR | 2015-0100516 A | | 9/2015 | |
| WO | WO-2014/187026 | | 11/2014 | |
| WO | WO-2015/130082 | | 9/2015 | |
| WO | WO-2018/180842 | | 10/2018 | |

OTHER PUBLICATIONS

International Search Report (Application No. PCT/IB2021/055731) Dated Sep. 28, 2021.

Written Opinion (Application No. PCT/IB2021/055731) Dated Sep. 28, 2021.

* cited by examiner

Cp
304
302
Vgs
307
305
308
COM

323

306
Vgs
303
301
309
COM 41a,41b
42
20
43p
43n 4041
231a
4042
4018
4005
221a
215
241a
4006
4001
232a

N2
4042
231a
4005
4018
N1
221a
215
241a
4006
232a
4001

4018
231a
4005
221a
215
241a
4006
232a
4001

842
746
729
728
772
771
742
726
723

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor apparatus, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor apparatus generally means a device that can function by utilizing semiconductor characteristics. A transistor and a semiconductor circuit are embodiments of semiconductor apparatuses. In some cases, a memory device, a display apparatus, an imaging device, or an electronic device includes a semiconductor apparatus.

BACKGROUND ART

A technique for forming transistors using a metal oxide formed over a substrate has been attracting attention. For example, a technique in which a transistor formed using zinc oxide or In—Ga—Zn-based oxide is used as a switching element or the like of a pixel of a display apparatus is disclosed in Patent Document 1 and Patent Document 2.

REFERENCE

Patent Document

[Patent Document 1] Japanese Published Patent Application No. 2007-123861

[Patent Document 2] Japanese Published Patent Application No. 2007-96055

SUMMARY OF THE INVENTION

Problems to be Solved by the Invention

In a display apparatus using a light-emitting device such as an organic EL element, the luminance of the light-emitting device is controlled by the current flowing through a driving transistor that is connected to one electrode of the light-emitting device.

In the case where an n-channel transistor is used as the driving transistor, a source of the driving transistor and an anode of the light-emitting device are connected. In display with a high grayscale level (display with high luminance), the cathode potential (the common potential) of the light-emitting device may vary or show the position dependence by being affected by the resistance of the electrode or the like. A variation in the cathode potential changes Vgs (gate-source voltage) of the n-channel transistor. Thus, there is a discrepancy between input image data and the luminance of the light-emitting device in some cases.

In the case where a p-channel transistor is used as the driving transistor, the above problem can be avoided. However, a general transistor using silicon in a channel formation region has a high off-state current and insufficient transfer characteristics for a low-level potential (low grayscale level). In addition, there is a problem of lack of layout flexibility such that a channel length needs to be lengthened in consideration of the saturation characteristics, the control of the magnitude of current, and the like.

In view of the above, an object of one embodiment of the present invention is to provide a display apparatus suitable for wide-grayscale display. Another object is to provide a display apparatus having excellent display characteristics.

Another object is to provide a display apparatus with low power consumption. Another object is to provide a highly reliable display apparatus. Another object is to provide a novel display apparatus or the like. Another object is to provide a method for operating any of the above display apparatuses. Another object is to provide a novel semiconductor apparatus or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to a display apparatus suitable for wide-grayscale display.

One embodiment of the present invention is a display apparatus including, in a pixel, a first transistor, a second transistor, and a light-emitting device; one of a source and a drain of the first transistor is electrically connected to one of a source and a drain of the second transistor, the other of the source and the drain of the second transistor is electrically connected to an anode of the light-emitting device, the first transistor is a p-channel transistor, and the second transistor is an n-channel transistor.

It is preferable that the first transistor contain silicon in a channel formation region, the second transistor contain a metal oxide in a channel formation region, and the metal oxide include In, Zn, and M (M is Al, Ti, Ga, Ge, Sn, Y, Zr, La, Ce, Nd, or Hf).

The pixel may further include a third transistor, a fourth transistor, and a fifth transistor, one of a source and a drain of the third transistor may be electrically connected to a gate of the first transistor, one of a source and a drain of the fourth transistor may be electrically connected to a gate of the second transistor, and one of a source and a drain of the fifth transistor may be electrically connected to the other of the source and the drain of the second transistor.

It is preferable that the third transistor, the fourth transistor, and the fifth transistor contain a metal oxide in channel formation regions, and the metal oxide include In, Zn, and M (M is Al, Ti, Ga, Ge, Sn, Y, Zr, La, Ce, Nd, or Hf).

The display apparatus may further include a first circuit, the first circuit has a function of outputting a first data potential and a second data potential, one of the first data potential and the second data potential is equivalent to an input potential to the first circuit, the other of the first data potential and the second data potential is a potential obtained by binarizing the input potential, the one of the first data potential and the second data potential is input to the gate of the first transistor through the third transistor, and the other of the first data potential and the second data potential is input to the gate of the second transistor through the fourth transistor.

The first circuit may include a CMOS inverter circuit which includes a p-channel transistor containing silicon in a channel formation region and an n-channel transistor containing a metal oxide in a channel formation region, and the metal oxide may include In, Zn, and M (M is Al, Ti, Ga, Ge, Sn, Y, Zr, La, Ce, Nd, or Hf).

Effect of the Invention

With the use of one embodiment of the present invention, a display apparatus suitable for wide-grayscale display can be provided. Alternatively, a display apparatus having excellent display characteristics can be provided.

Alternatively, a display apparatus with low power consumption can be provided. Alternatively, a highly reliable display apparatus can be provided. Alternatively, a novel display apparatus or the like can be provided. Alternatively, a method for operating any of the above display apparatuses can be provided. Alternatively, a novel semiconductor apparatus or the like can be provided.

MODE FOR CARRYING OUT THE INVENTION

Figure 1:
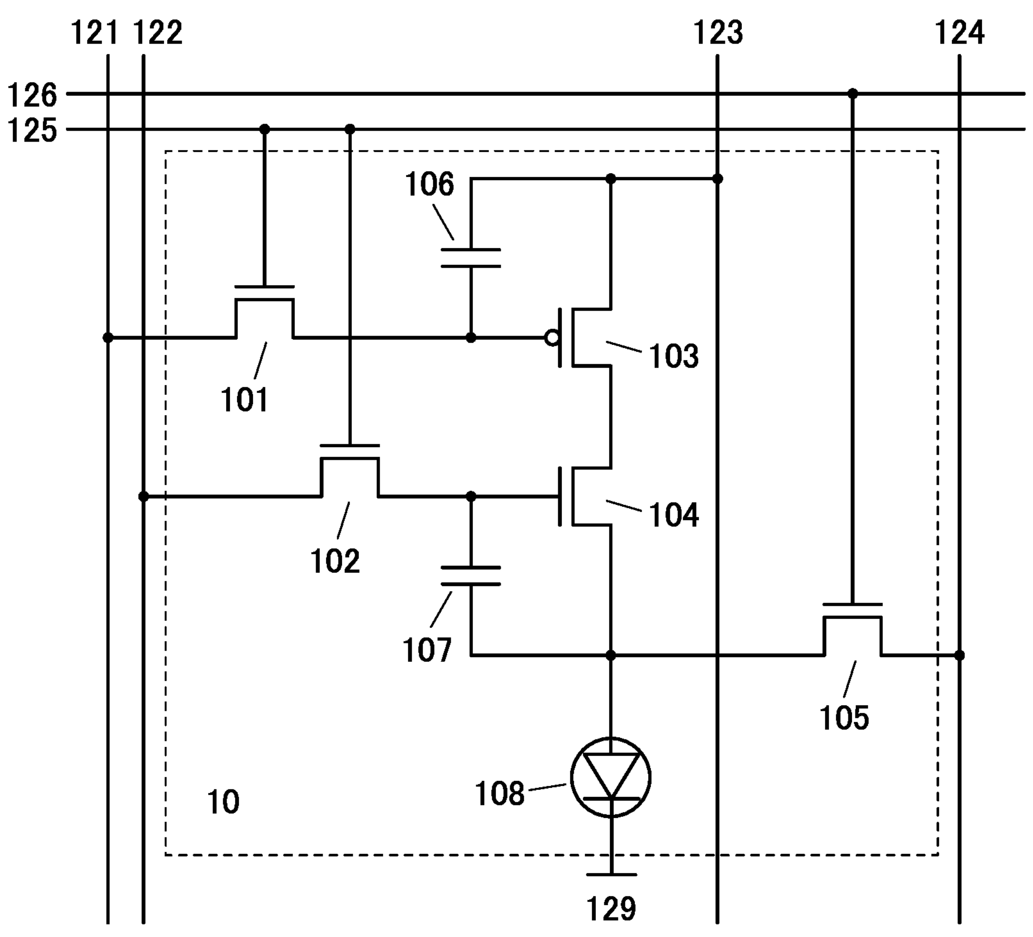
FIG. 1 is a diagram illustrating a pixel circuit.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

In addition, one conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a configuration is included in direct connection.

Embodiment 1

In this embodiment, a display apparatus of one embodiment of the present invention will be described with reference to drawings.

One embodiment of the present invention is a display apparatus provided with two transistors each having a function of a driving transistor and one light-emitting device (also referred to as a light-emitting element) in a pixel. The two transistors and the light-emitting device are connected in series. When one of the transistors operates as the driving transistor, the other of the transistors operates as a switch.

The two transistors are a combination of a p-channel transistor and an n-channel transistor. The p-channel transistor functions as the driving transistor in display with a high grayscale level (display with high luminance). At this time, the n-channel transistor is in a low-resistance on state. The n-channel transistor functions as the driving transistor in display with a low grayscale level (display with low luminance). At this time, the p-channel transistor is in a low-resistance on state. Such a configuration can inhibit the change in a gate-source voltage (Vgs) in display with a high grayscale level.

In addition, the use of a transistor containing a metal oxide in a channel formation region (hereinafter, OS transistor) as the n-channel transistor enables an increase in display characteristics in display with a low grayscale level. The OS transistor has a feature of an extremely low off-state current.

Switching of the driving transistor is performed according to a binary signal potential input to the pixel. The binary signal potential is generated in the signal generator circuit positioned between the source driver and the pixel. The signal generator circuit outputs two signal potentials, a data potential input from the source driver and a potential obtained by binarizing the data potential, to the pixel. The binary signal potential can be used as the gate potential for making the transistor operating as a switch be in the low-resistance on state.

FIG. 1 is a circuit diagram of a pixel included in a display apparatus of one embodiment of the present invention. A pixel 10 includes a transistor 101, a transistor 102, a transistor 103, a transistor 104, a transistor 105, a capacitor 106, a capacitor 107, and a light-emitting device 108. Note that a configuration in which the transistor 105 is not provided can also be employed.

One of a source and a drain of the transistor 101 is electrically connected to one electrode of the capacitor 106 and a gate of the transistor 103. One of a source and a drain of the transistor 102 is electrically connected to one electrode of the capacitor 107 and a gate of the transistor 104. One of a source and a drain of the transistor 103 is electrically connected to one of a source and a drain of the transistor 104. The other of the source and the drain of the transistor 103 is electrically connected to the other electrode of the capacitor 106. The other electrode of the transistor 104 is electrically connected to an anode of the light-emitting device 108, the other electrode of the capacitor 107, and one of a source and a drain of the transistor 105.

The other of the source and the drain of the transistor 101 is electrically connected to a wiring 121. The other of the source and the drain of the transistor 102 is electrically connected to a wiring 122. The other of the source and the drain of the transistor 103 is electrically connected to a wiring 123. The other of the source and the drain of the transistor 105 is electrically connected to a wiring 124. A cathode of the light-emitting device 108 is electrically connected to a wiring 129. A gate of the transistor 101 and a gate of the transistor 102 is electrically connected to a wiring 125. A gate of the transistor 105 is electrically connected to a wiring 126.

The wiring 121 and the wiring 122 is a source line that connects a signal generator circuit 40 and a source driver 20 described later to the pixel 10. The wiring 123 and the wiring 129 are power supply lines: the wiring 123 can be a high potential power supply line and the wiring 129 can be a low potential power supply line. The wiring 124 is a wiring that supplies a reset potential (e.g., low potential). Each of the wiring 125 and the wiring 126 is a gate line that controls the operation of a transistor connected thereto.

Here, each of the transistor 101, the transistor 102, and the transistor 105 functions as a switch. Each of the transistor 103 and the transistor 104 functions as a driving transistor or a switch of the light-emitting device 108. The transistor 103 is a p-channel transistor and the transistor 104 is an n-channel transistor. Each of the capacitor 106 and the capacitor 107 functions as a storage capacitor. The transistor 101, the transistor 102, and the transistor 105 are illustrated as n-channel transistors in FIG. 1, but may be p-channel transistors.

Figure 2A:
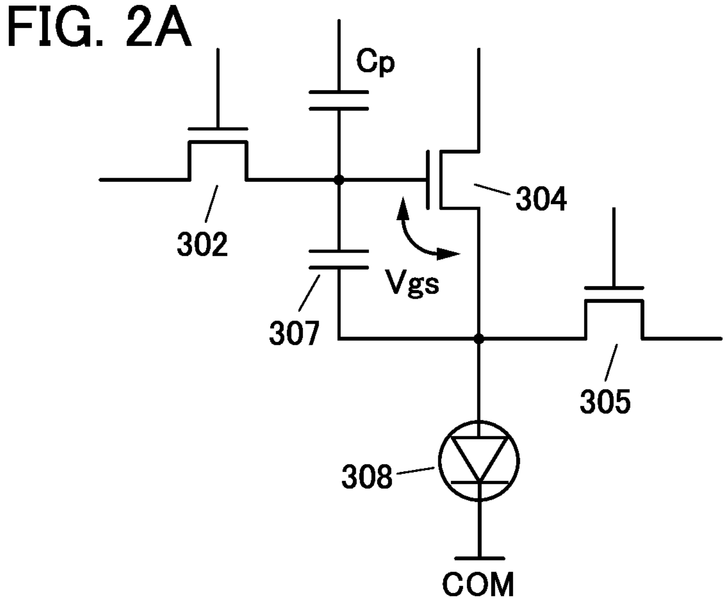
FIG. 2A and FIG. 2B are diagrams illustrating conventional pixel circuits.

An example of the conventional pixel circuit, which includes three n-channel transistors (transistors 302, 304, 305), a capacitor 307, and a light-emitting device 308, is illustrated in FIG. 2A.

The transistor 304 serves as a driving transistor and a data potential is supplied to a gate of the transistor 304 through the transistor 302. At this time, a reset potential is supplied to a source of the transistor 304 through the transistor 305 in advance. That is, a gate potential can be supplied to the transistor 304 with the source potential thereof stabilized, thus Vgs is at the ideal value.

The display apparatus has a plurality of light-emitting devices whose cathodes are connected to a common electrode COM. In the case where a light-transmitting conductive film (e.g., indium tin oxide and the like) having higher resistance than metal is used as the common electrode COM, a flow of high current in display with a high grayscale level (display with high luminance) may cause a voltage drop in the common electrode COM. At the time of light emission, the light-emitting device also operates as a constant voltage element; therefore, as the potential of the common electrode COM (the cathode potential) varies, the anode potential also varies.

Ideally, Vgs is maintained by the capacitor 307 serving as a storage capacitor; however, the amount of variation in the gate potential of the transistor 304 becomes smaller than that in the source potential (the anode potential) owing to the influence of the parasitic capacitance Cp added to the gate of the transistor 304. In other words, there is a problem of not being able to obtain desired luminance because of decreased Vgs.

Figure 2B:
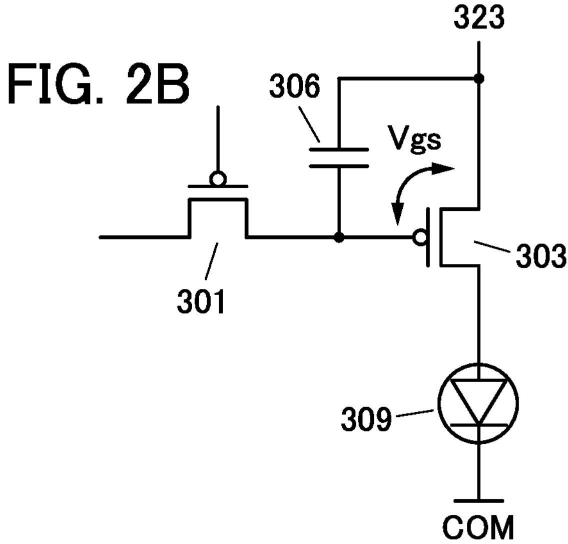

Another example of the conventional pixel circuit, which includes two p-channel transistors (transistor 301 and transistor 303), a capacitor 306, and a light-emitting device 309, is illustrated in FIG. 2B.

The transistor 303 serves as a driving transistor and a data potential is supplied to a gate of the transistor 303 through the transistor 301. Here, a source of the transistor 303 is electrically connected to a power supply line 323 for which a low-resistance metal wiring or the like can be used, whereby the source potential is always stable; thus Vgs is at the ideal value.

However, the p-channel transistor is generally formed of a transistor containing silicon in a channel formation region (hereinafter, Si transistor). A Si transistor has poor transfer characteristics for a low-level potential owing to its relatively high off-state current. Thus, there is a problem of not being able to give a sufficient grayscale performance in display with a low grayscale level (display with low luminance).

In addition, in the case where a Si transistor is used in the pixel circuit, there is a problem of lack of layout flexibility such that a channel length needs to be lengthened in consideration of the saturation characteristics, the control of the magnitude of current, and the like.

One embodiment of the present invention is a display apparatus suitable for wide-grayscale display that can make up for the above-mentioned disadvantages of the conventional circuit and the Si transistor.

In the display apparatus of one embodiment of the present invention, the transistor 103 (p-channel Si transistor) is used as the driving transistor in display with a high grayscale level. The transistor 104 (n-channel OS transistor) is used as the driving transistor in display with a low grayscale level (display with low luminance). As the transistor 101, the transistor 102, and the transistor 105, either a Si transistor or an OS transistor may be used.

Such a configuration can inhibit the change in Vgs in display with a high grayscale level that is caused in the case where the n-channel transistor is used as the driving transistor; therefore, the display quality for a high grayscale level can be improved.

Furthermore, since relatively high current flows for control in display with a high grayscale level, it is unnecessary to lengthen the channel length to reduce current. Accordingly, a transistor with a short channel length can be used, which can increase the layout flexibility. In addition, display is not affected even when the Si transistor, whose off-state current is relatively high, is used.

Amorphous silicon, microcrystalline silicon, polycrystalline silicon, single crystal silicon, or the like can be used for the channel formation region of the Si transistor. Note that polycrystalline silicon is preferably used in the case where a transistor is provided on an insulating surface of a glass substrate or the like and the transistor is a p-channel transistor.

High-quality polycrystalline silicon, which can be obtained easily by using a laser crystallization step or the like, can be used to form a transistor having high mobility even when the transistor is a p-channel type. The high-quality polycrystalline silicon can also be obtained by a solid-phase growth method in which a metal catalyst such as nickel or palladium is added to amorphous silicon and then heated. To enhance crystallinity, the polycrystalline silicon formed by the solid-phase growth method using a metal catalyst may be subjected to laser irradiation. Note that the metal catalyst remains in the polycrystalline silicon and worsens electrical characteristics of the transistor; therefore, it is preferable to provide a region to which phosphorus, a rare gas, or the like is added other than the channel formation region, whereby the region captures the metal catalyst.

In display with a low grayscale level, the driving transistor is an n-channel transistor. In display with many low-grayscale-level sections, the current flowing through the entire pixels of the display apparatus is relatively low; accordingly, the voltage drop in the common electrode connected to the cathodes of the light-emitting devices is less likely to occur. That is, an influence of the above-described change in Vgs can be ignored. Furthermore, using the OS transistor as the n-channel transistor is preferable.

In the OS transistor, the semiconductor layer has a large energy gap, and thus the OS transistor can have an extremely low off-state current of several yA/μm (current per micrometer of a channel width). Therefore, transfer characteristics for a low-level potential is improved compared with the case of using the Si transistor as the driving transistor; therefore, the display quality for a low grayscale level can be improved.

Moreover, the OS transistor is preferably used as the transistor 101 and the transistor 102 as well. The gate potentials of the driving transistors (transistor 103 and transistor 104) can be retained for a long time by the low off-state current characteristics of the OS transistors. Accordingly, an image can be retained even when the frame frequency is lowered. For example, switching between the first frame frequency (e.g., 60 Hz or more) in moving image display and the second frame frequency which is lower than the first frame frequency (e.g., approximately 1 to 10 Hz) in still image display can reduce power consumption of the display apparatus.

Note that structures by which the effect of one embodiment of the present invention is obtained are not limited to those described above: the Si transistors may be used as all the transistors included in the pixel. Alternatively, the OS transistors may be used as all the transistors included in the pixel.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and M (metals such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide can be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the deposited semiconductor layer may vary from the above atomic ratio between metal elements in the sputtering target in a range of ±40%. An oxide semiconductor with low carrier density is used for the semiconductor layer. For example, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (the concentration obtained by secondary ion mass spectrometry) in the semiconductor layer is set to $2\times10^{18}$ atoms/cm$^3$ or lower, preferably $2\times10^{17}$ atoms/cm$^3$ or lower.

An alkali metal and an alkaline earth metal might generate carriers when bonded to an oxide semiconductor, in which case the off-state current of the transistor might be increased. Thus, the concentration of alkali metal or alkaline earth metal in the semiconductor layer (the concentration obtained by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons serving as carriers are generated and the carrier density increases, so that the semiconductor layer easily becomes n-type. Thus, a transistor using an oxide semiconductor that contains nitrogen is likely to have normally-on characteristics. Hence, the concentration of nitrogen in the semiconductor layer (the concentration obtained by secondary ion mass spectrometry) is preferably set to $5\times10^{18}$ atoms/cm$^3$ or lower.

Specifically, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the defects in the oxide semiconductor are sometimes evaluated not by its donor concentration but by its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, will be described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1\leq x0\leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor device, the insulating property derived from $GaO_{X3}$ or the like and the conductivity derived from $In_{X2}Zn_{Y2}O_{Z2}$ or $InO_{X1}$ complement each other, whereby a high on-state current (Ion) and a high field-effect mobility (μ) can be achieved.

A semiconductor device using a CAC-OS has high reliability. Thus, the CAC-OS is suitably used as a material in a variety of semiconductor apparatuses.

In display with a high grayscale level, the transistor 104 is a resistor when the transistor 103 is used as the driving transistor. Thus, the gate potential for making the transistor 104 be in the low-resistance on state (on state as the switch) is supplied to the transistor 104. In display with a low grayscale level, the transistor 103 is a resistor when the transistor 104 is used as the driving transistor. Thus, the gate potential for making the transistor 103 be in the low-resistance on state (on state as the switch) is supplied to the transistor 103.

As described above, a data potential for display and a potential for switching are supplied to the pixel 10. In one embodiment of the present invention, the potential for switching can be generated using the signal generator circuit on the basis of the data potential supplied from the source driver.

Figures 3A, 3B:
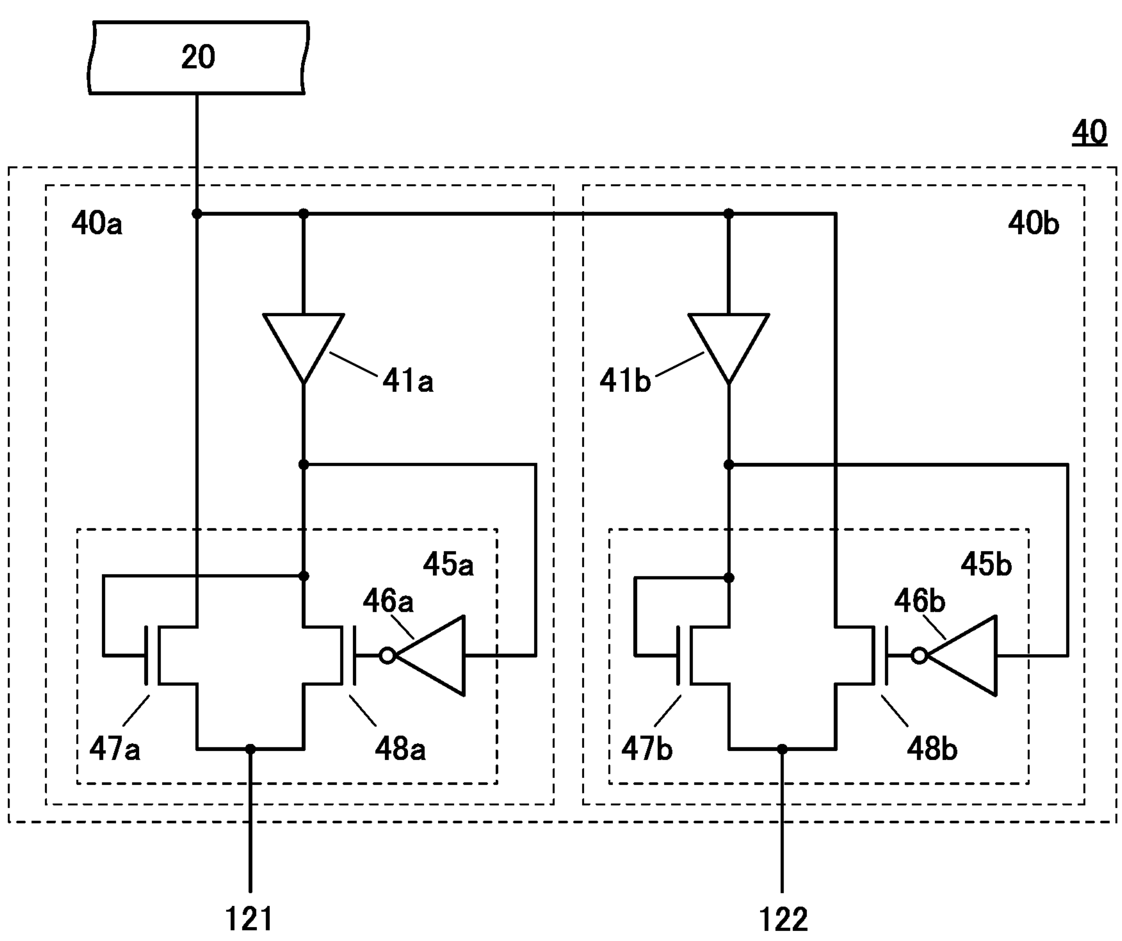
FIG. 3A is a diagram illustrating a signal generator circuit.
FIG. 3B is a diagram illustrating a buffer circuit.

FIG. 3A is a diagram illustrating the signal generator circuit 40 electrically connected between the source driver 20 and the pixel 10. The signal generator circuit includes a circuit 40*a* and a circuit 40*b*.

A signal potential generated by the circuit 40*a* is output to the wiring 121. That is, the circuit 40*a* is a circuit for generating a signal potential which controls the transistor 103. A signal potential generated by the circuit 40*b* is output to the wiring 122. That is, the circuit 40*b* is a circuit for generating a signal potential which controls the transistor 104.

The circuit 40*a* includes a buffer circuit 41*a* and a selection circuit 45*a*. The buffer circuit 41*a* can have a structure in which an even number of stages of CMOS inverter circuits 42, which are as illustrated in FIG. 3B, are connected in series, for example. The CMOS inverter circuit 42 can have a structure in which a p-channel transistor 43*p* and an n-channel transistor 43*n* are included. Although a structure in which two stages of the CMOS inverter circuits 42 are connected in series is illustrated in FIG. 3B, four or more even number of stages of the CMOS inverter circuits 42 may be connected in series.

The selection circuit 45*a* includes an inverter circuit 46*a*, a transistor 47*a*, and a transistor 48*a*. An output terminal of the source driver 20 is electrically connected to one of a source and a drain of the transistor 47*a* and an input terminal of the buffer circuit 41*a*. An output terminal of the buffer circuit 41*a* is electrically connected to a gate of the transistor 47*a*, one of a source and a drain of the transistor 48*a*, and an input terminal of the inverter circuit 46*a*. An output terminal of an inverter circuit 46*b* is electrically connected to a gate of the transistor 48*a*. The other of the source and the drain of the transistor 47*a* and the other of the source and the drain of the transistor 48*a* are electrically connected to the wiring 121.

The circuit 40*b* includes a buffer circuit 41*b* and a selection circuit 45*b*. The structure of the buffer circuit 41*b* can be similar to that of the buffer circuit 41*a*.

The selection circuit 45*b* includes the inverter circuit 46*b*, a transistor 47*b*, and a transistor 48*b*. The output terminal of the source driver 20 is electrically connected to one of a source and a drain of the transistor 48*b* and an input terminal of the buffer circuit 41*b*. An output terminal of the buffer circuit 41*b* is electrically connected to a gate of the transistor 47*b*, one of a source and a drain of the transistor 47*b*, and an input terminal of the inverter circuit 46*b*. The output terminal of the inverter circuit 46*b* is electrically connected to a gate of the transistor 48*b*. The other of the source and the drain of the transistor 47*b* and the other of the source and the drain of the transistor 48*b* are electrically connected to the wiring 122.

Si transistors can be used to form the signal generator circuit 40. Alternatively, Si transistors and OS transistors may be used as the p-channel transistors and the n-channel transistors included in the signal generator circuit 40, respectively. When the OS transistor is used as the transistor 104 in the pixel 10, the use of OS transistors as the n-channel transistors of the signal generator circuit 40 can eliminate the need for the step of forming Si transistors as the n-channel transistors and reduce a manufacturing cost.

A potential input to the signal generator circuit 40 is a data potential output from the source driver 20, and the buffer circuit 41*a* and the buffer circuit 41*b* have a function of binarizing the data potential. Accordingly, the data potential and the binarized data potential are input to the selection circuit 45*a* and the selection circuit 45*b*. Table 1 shows the signal potentials output from the signal generator circuit 40 (selection circuit 45*a* and selection circuit 45*b*) at this time.

TABLE 1

| Input potential of signal generator circuit 40 | Output potential of selection circuit 45a | Output potential of selection circuit 45b |
|---|---|---|
| "DataH" | "DataH" | "H" |
| "DataL" | "L" | "DataL" |

Note that a circuit having a structure other than the structure illustrated in FIG. 3A may be used as the signal generator circuit 40 so long as the output potential of the selection circuit 45*a* and the output potential of the selection circuit 45*b* with respect to the input potential of the signal generator circuit 40 are the same as Table 1.

Figure 4A:
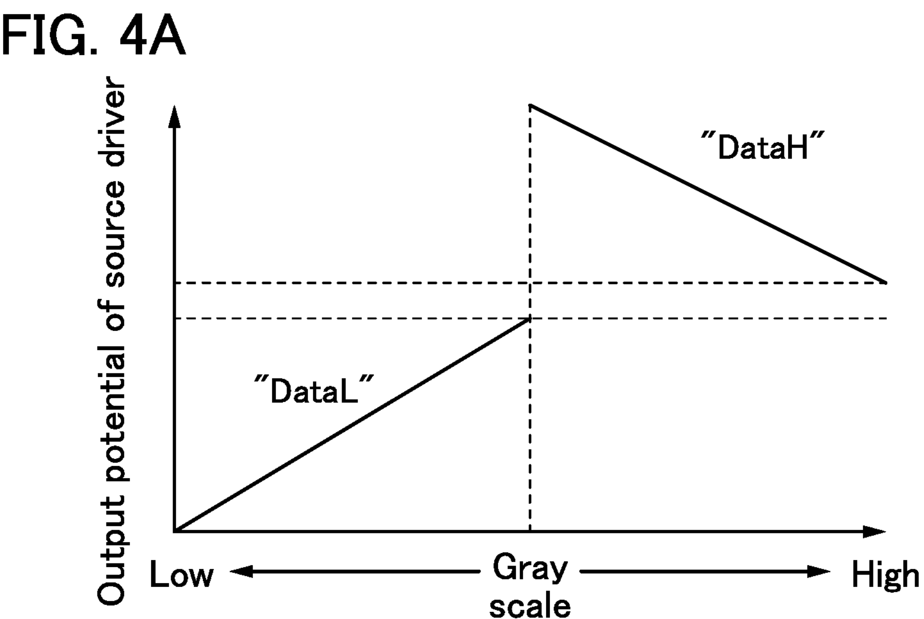
FIG. 4A is a graph showing an output potential of a source driver.

Here, each of "DataH" and "DataL" is a data potential (image data). FIG. 4A is a graph showing the relation between the grayscale of display and the output potential of the source driver 20. The output potential on the low grayscale level side is "DataL" and the output potential on the high grayscale level side is "DataH". In FIG. 4A, the boundary between the both sides is at the grayscale near the center, but may be positioned at the lower or higher grayscale level than near the center.

"DataL" is a data potential input to the gate of the transistor 104 that is the n-channel transistor. Thus, the output potential is proportional to the grayscale level: the higher the grayscale level is, the higher the output potential becomes. "DataH" is a data potential input to the gate of the transistor 103 that is the p-channel transistor. Thus, the output potential is inversely proportional to the grayscale level: the higher the grayscale level is, the lower the output potential becomes.

"DataH" and "DataL" output from the selection circuit 45*a* and the selection circuit 45*b* respectively are potentials equivalent to the output potential of the source driver 20.

Figure 4B:
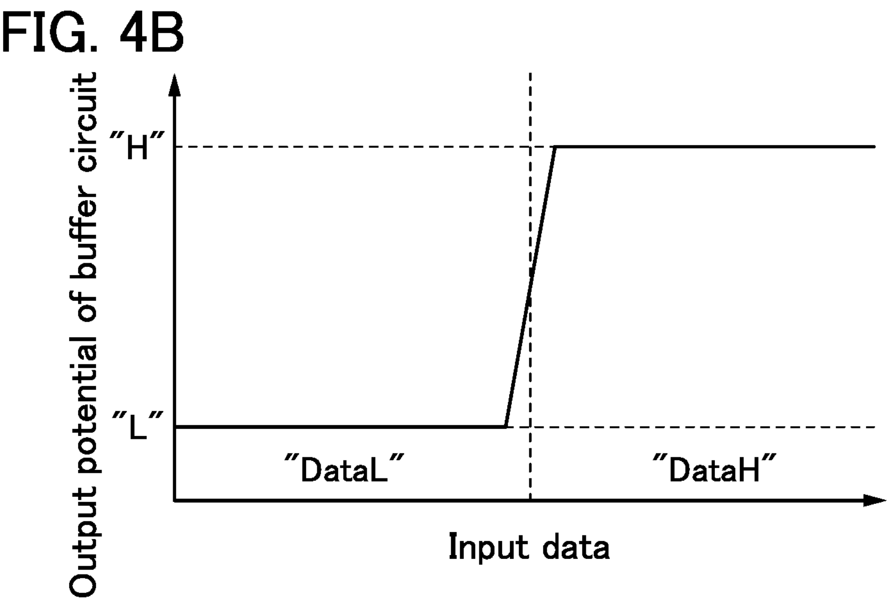
FIG. 4B is a graph showing an output potential of the buffer circuit.

"H" is the binarized high-level potential and "L" is the binarized low-level potential. FIG. 4B is a graph showing output characteristics of the buffer circuit 41*a* or the buffer circuit 41*b*. The input data is the data potential output from the source driver 20, and the binarized potential "L" is output by the operation of two stages of the inverters when the above-described "DataL" is input. The binarized potential "H" is output by the operation of two stages of the inverters when "DataH" is input.

The potential "L" output from the selection circuit 45*a* and the potential "H" output from the selection circuit 45*b* are each a potential obtained by binarizing the data potential output from the source driver 20 in the buffer circuit 41*a* or the buffer circuit 41*b*. The relationship between the "DataH", "DataL", "H", and "L" is "L"≤"DataL"<"DataH"≤"H".

Figure 5:
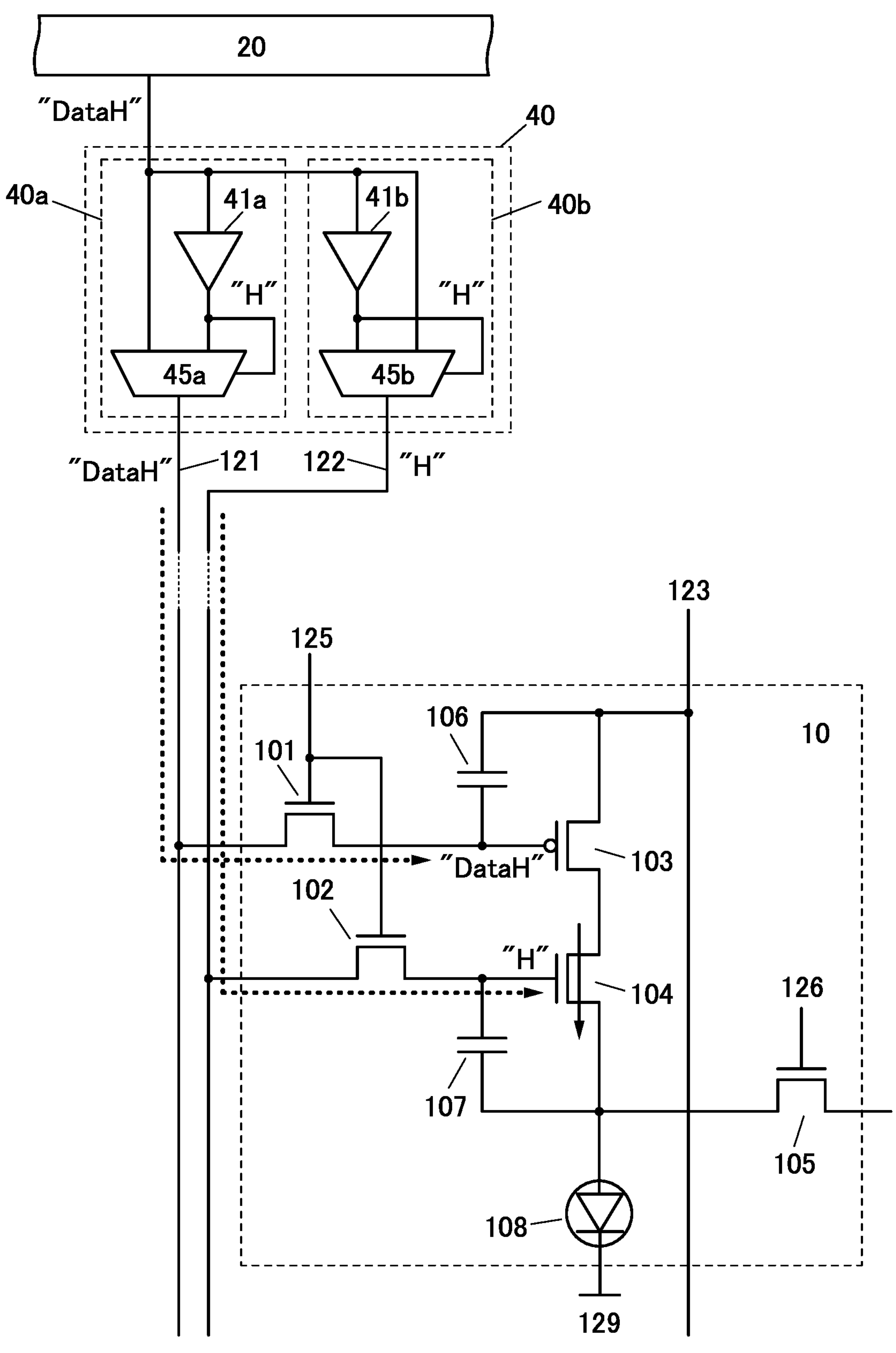
FIG. 5 is a diagram illustrating the operation of a signal generator circuit and a pixel circuit.

FIG. 5 is a diagram illustrating the operation of the signal generator circuit 40 and the pixel 10 when the data potential output from the source driver 20 is "DataH" (high grayscale). As shown in Table 1, when the data potential "DataH" is input to the signal generator circuit 40 from the source driver 20, the signal generator circuit 40 outputs the data potential "DataH" and the potential "H" to the wiring 121 and the wiring 122 respectively.

The data potential "DataH" is input to the gate of the transistor 103 through the transistor 101, and the current based on the data potential "DataH" flows through the transistor 103. The potential "H" is input to the gate of the transistor 104 through the transistor 102. Being the n-channel transistor, the transistor 104 is in the low-resistance on state at this time.

That is, the transistor 103 operates as the driving transistor of the light-emitting device 108 and the transistor 104 operates as a switch.

Since the transistor 104 does not operate as the driving transistor, display is not affected even when a variation in the anode potential of the light-emitting device 108 in display with a high grayscale level changes Vgs. Therefore, the display quality for a high grayscale level can be improved.

Figure 6:
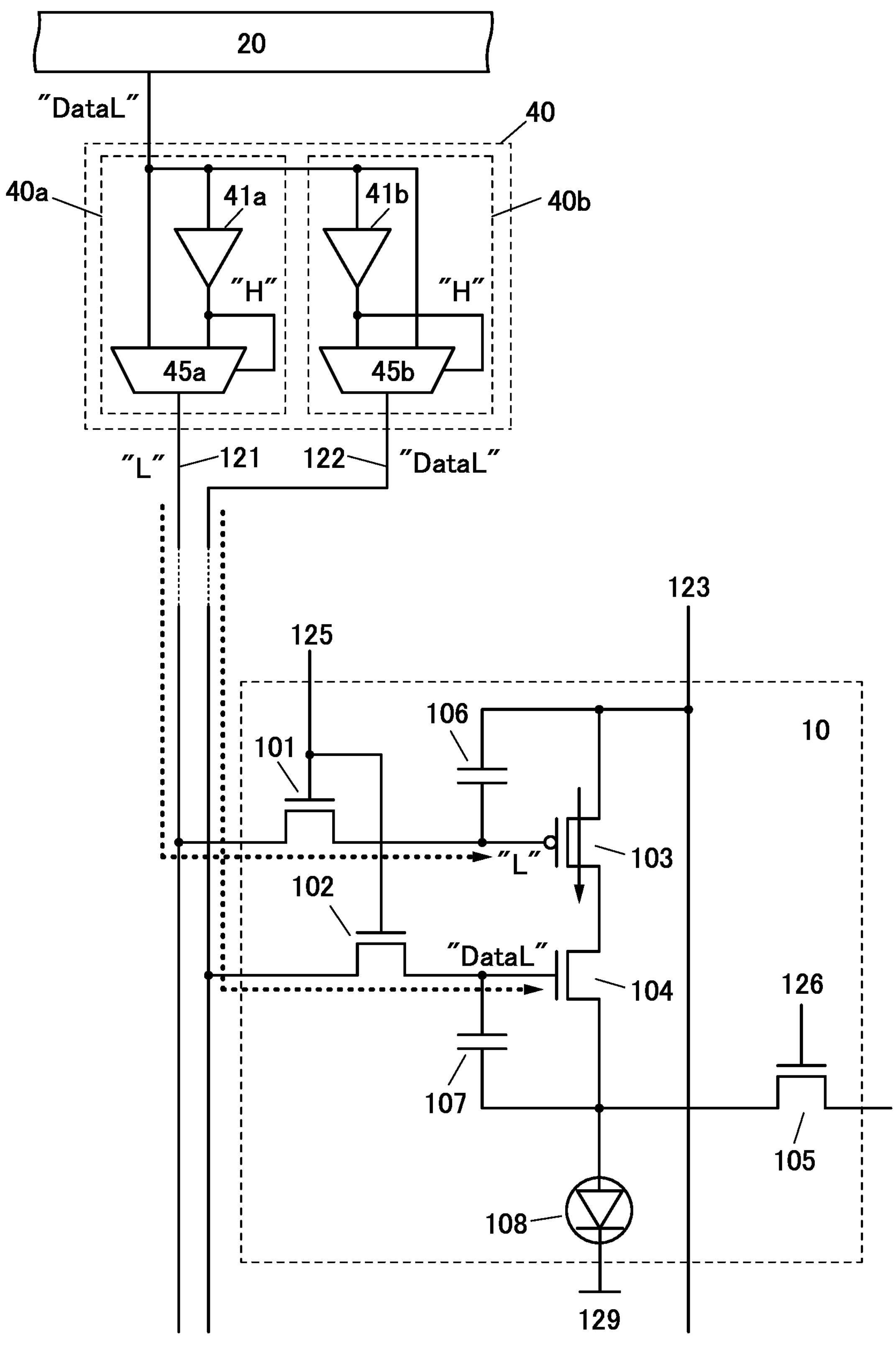
FIG. 6 is a diagram illustrating the operation of a signal generator circuit and a pixel circuit.

FIG. 6 is a diagram illustrating the operation of the signal generator circuit 40 and the pixel 10 when the data potential output from the source driver 20 is "DataL" (low grayscale). As shown in Table 1, when the data potential "DataL" is input to the signal generator circuit 40 from the source driver 20, the signal generator circuit 40 outputs the potential "L" and the data potential "DataL" to the wiring 121 and the wiring 122 respectively.

The potential "L" is input to the gate of the transistor 103 through the transistor 101. Being the p-channel transistor, the transistor 103 is in the low-resistance on state at this time. The data potential "DataL" is input to the gate of the transistor 104 through the transistor 102, and the current based on the data potential "DataL" flows through the transistor 104.

That is, the transistor 103 operates as a switch and the transistor 104 operates as the driving transistor of the light-emitting device 108.

Here, the use of the OS transistor, whose off-state current is low, as the transistor 104 can increase the grayscale performance in display with a low grayscale level. In other words, the display quality from low to high grayscale levels can be improved in the display apparatus of one embodiment of the present invention.

Figure 7:
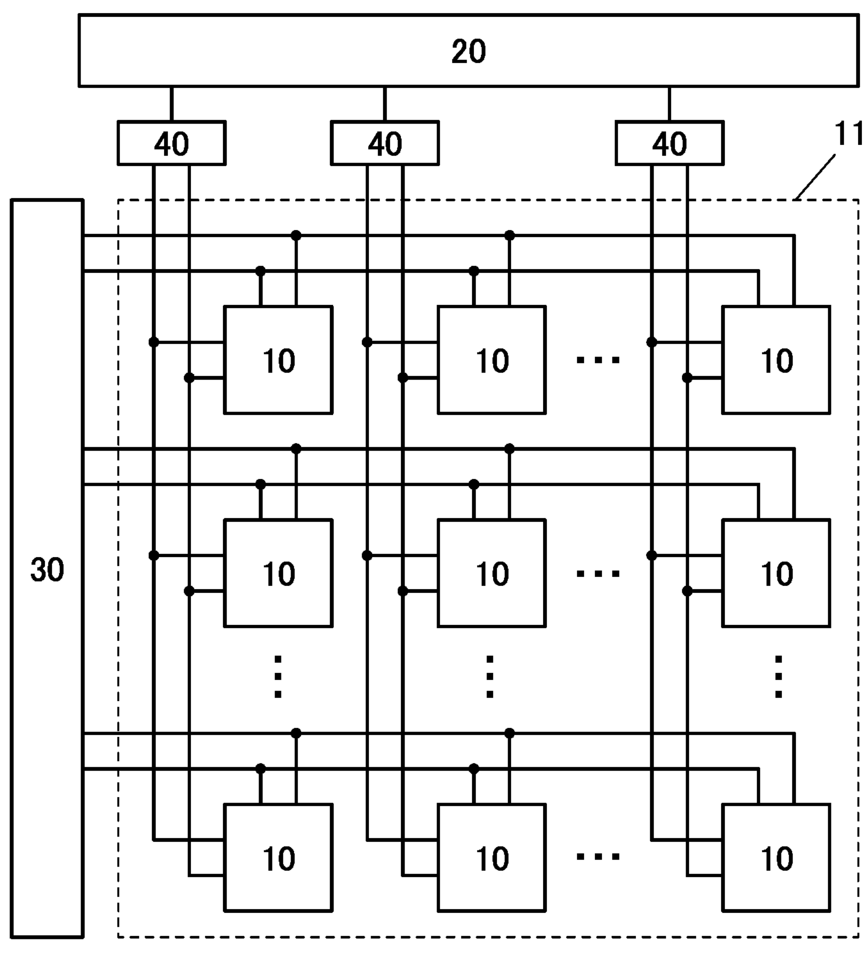
FIG. 7 is a diagram illustrating a display apparatus.

FIG. 7 is a diagram illustrating a display apparatus of one embodiment of the present invention. The display apparatus includes a pixel array 11, the source driver 20, a gate driver 30, and the signal generator circuit 40. The pixel array 11 includes pixels 10 arranged in the column direction and the row direction. The pixel 10 includes the two driving transistors described in this embodiment. Note that wirings are illustrated in a simplified way in the drawing, and the wirings connected to components of the above-described pixel 10 of one embodiment of the present invention are provided.

A sequential circuit such as a shift register can be used for the source driver 20 and the gate driver 30.

Note that for the source driver 20 and the gate driver 30, a method in which an IC chip is attached externally by a COF (chip on film) method, a COG (chip on glass) method, a TCP (tape carrier package) method, or the like can be used. Alternatively, the source driver 20 and the gate driver 30 may be formed on the same substrate as that of the pixel array 11, using transistors manufactured using the same process as that of the pixel array 11.

Although an example in which the gate driver 30 is placed on one side of the pixel array 11 is shown, two gate drivers 30 may be placed with the pixel array 11 placed therebetween to divide driving rows.

This embodiment can be implemented in an appropriate combination with any of the structures described in the other embodiments.

Embodiment 2

In this embodiment, a structure example of a display apparatus using a light-emitting device will be described. Note that the description of the components, operations, and functions of the display apparatus described in Embodiment 1 is omitted in this embodiment.

The pixel 10 and the signal generator circuit 40 described in Embodiment 1 can be used in the display apparatus described in this embodiment. Note that a scan line driver circuit and a signal line driver circuit which are described below correspond to the gate driver and the source driver, respectively.

Figures 8A, 8B, 8C:
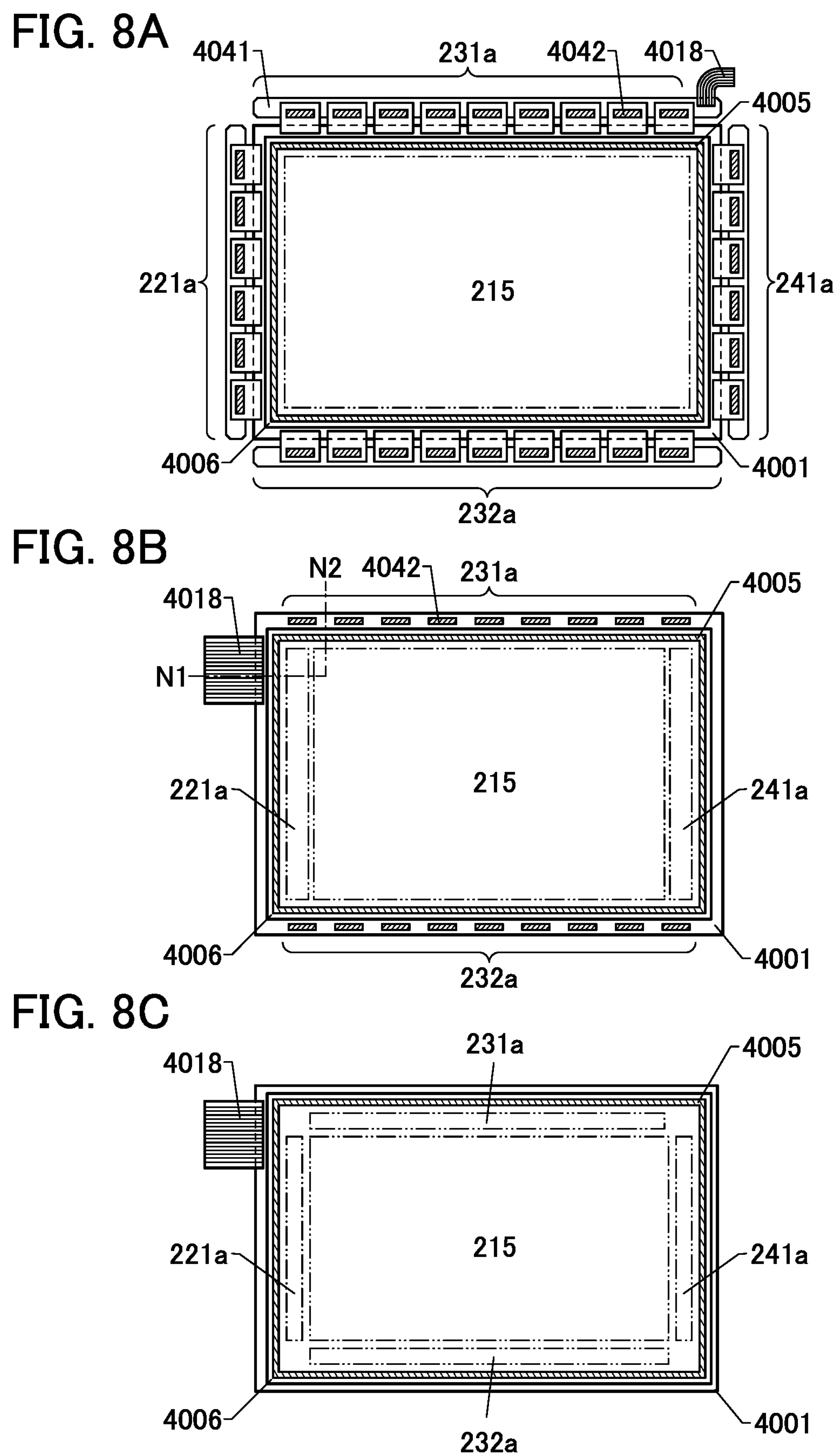
FIG. 8A to FIG. 8C are diagrams illustrating display apparatuses.

FIG. 8A to FIG. 8C are diagrams each illustrating a structure of a display apparatus in which one embodiment of the present invention can be used.

In FIG. 8A, a sealant 4005 is provided to surround a display portion 215 provided over a first substrate 4001, and the display portion 215 is sealed with the sealant 4005 and a second substrate 4006.

In FIG. 8A, a scan line driver circuit 221*a*, a signal line driver circuit 231*a*, a signal line driver circuit 232*a*, and a common line driver circuit 241*a* each include a plurality of integrated circuits 4042 provided over a printed circuit board 4041. The integrated circuits 4042 are each formed using a single crystal semiconductor or a polycrystalline semiconductor. The common line driver circuit 241*a* has a function of supplying a prescribed potential to the wirings 123, 124, 129, and the like described in Embodiment 1.

Signals and potentials are supplied to the scan line driver circuit 221*a*, the common line driver circuit 241*a*, the signal line driver circuit 231*a*, and the signal line driver circuit 232*a* through an FPC (Flexible printed circuit) 4018.

The integrated circuits 4042 included in the scan line driver circuit 221*a* and the common line driver circuit 241*a* each have a function of supplying a selection signal to the display portion 215. The integrated circuits 4042 included in the signal line driver circuit 231*a* and the signal line driver circuit 232*a* each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF method, a COG method, a TCP method, or the like can be used.

FIG. 8B illustrates an example in which the integrated circuits 4042 included in the signal line driver circuit 231*a* and the signal line driver circuit 232*a* are mounted by a COG method. Some or all of the driver circuits can be formed over the same substrate as the display portion 215, whereby a system-on-panel can be formed.

In the example illustrated in FIG. 8B, the scan line driver circuit 221*a* and the common line driver circuit 241*a* are formed over the same substrate as the display portion 215. When the driver circuits are formed concurrently with pixel circuits in the display portion 215, the number of components can be reduced. Accordingly, the productivity can be increased.

In FIG. 8B, the sealant 4005 is provided to surround the display portion 215, the scan line driver circuit 221*a*, and the common line driver circuit 241*a* provided over the first substrate 4001. The second substrate 4006 is provided over the display portion 215, the scan line driver circuit 221*a*, and the common line driver circuit 241*a*. Consequently, the display portion 215, the scan line driver circuit 221*a*, and the common line driver circuit 241*a* are sealed with the use of the first substrate 4001, the sealant 4005, and the second substrate 4006 together with the display device.

Although the signal line driver circuit 231*a* and the signal line driver circuit 232*a* are separately formed and mounted on the first substrate 4001 in the example illustrated in FIG. 8B, one embodiment of the present invention is not limited to this structure. The scan line driver circuit may be separately formed and then mounted, part of the signal line driver circuits or part of the scan line driver circuits may be separately formed and then mounted. The signal line driver circuit 231*a* and the signal line driver circuit 232*a* may be formed over the same substrate as the display portion 215, as illustrated in FIG. 8C.

In some cases, the display device encompasses a panel in which the display device is sealed, and a module in which an IC or the like including a controller is mounted on the panel.

The display portion and the scan line driver circuit provided over the first substrate each include a plurality of transistors. As the transistors, the Si transistor or the OS transistor described in Embodiment 1 can be used.

The transistors included in the peripheral driver circuit and transistors included in the pixel circuits of the display portion may have the same structure or different structures. The transistors included in the peripheral driver circuit may have the same structure, or two or more kinds of structures may be used in combination. Similarly, the transistors included in the pixel circuits may have the same structure, or two or more kinds of structures may be used in combination.

An input apparatus 4200 can be provided over the second substrate 4006. The display apparatuses illustrated in FIG. 8A to FIG. 8C and provided with the input apparatus 4200 can function as a touch panel.

There is no particular limitation on a sensor device (also referred to as a sensor element) included in the touch panel of one embodiment of the present invention. A variety of sensors capable of sensing an approach or a contact of a sensing target such as a finger or a stylus can be used as the sensor device.

For example, a variety of types such as a capacitive type, a resistive type, a surface acoustic wave type, an infrared type, an optical type, and a pressure-sensitive type can be used for the sensor.

In this embodiment, a touch panel including a capacitive sensor device will be described as an example.

Examples of the capacitive sensor device include a surface capacitive sensor device and a projected capacitive sensor device. Examples of the projected capacitive sensor device include a self-capacitive sensor device and a mutual capacitive sensor device. The use of a mutual capacitive sensor device is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 9A:
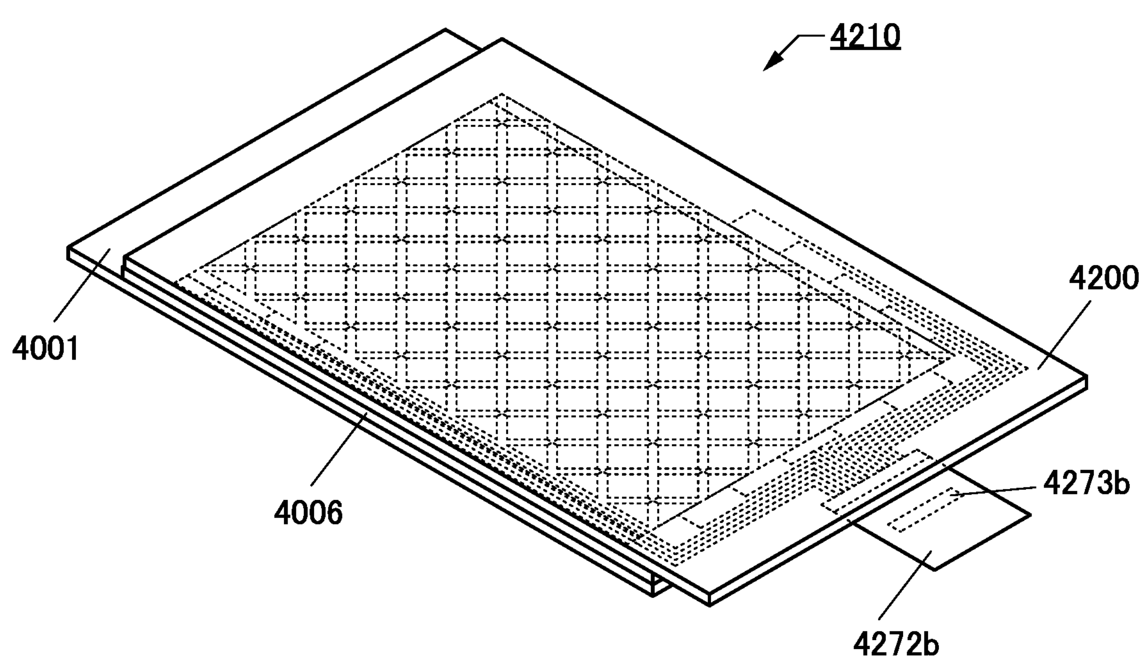
FIG. 9A and FIG. 9B are diagrams illustrating a touch panel.
Figure 9B:
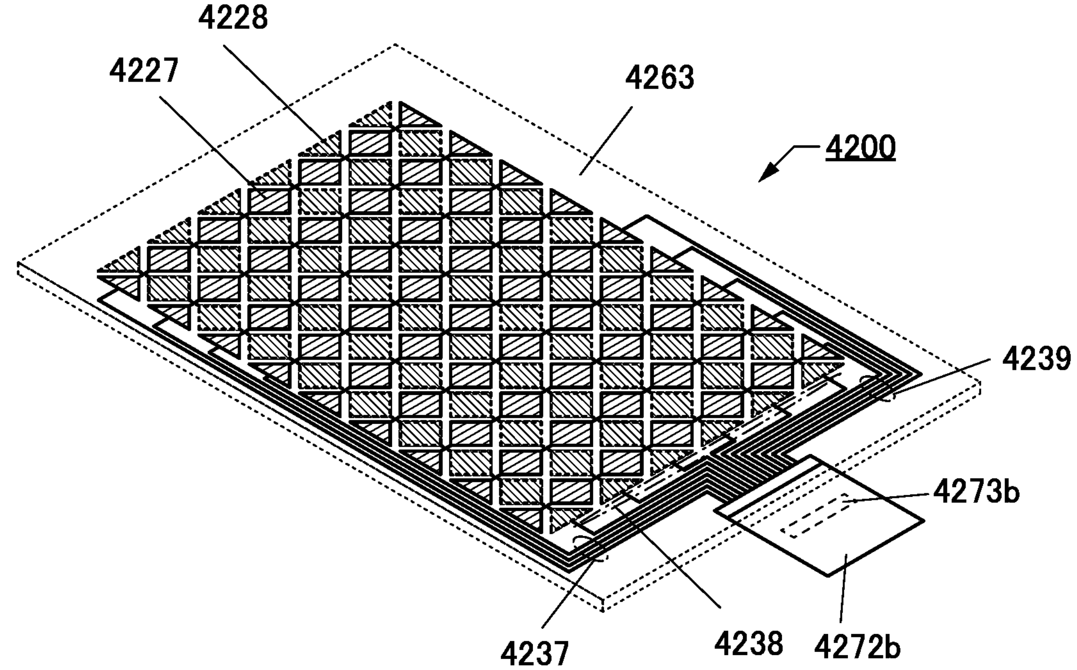

FIG. 9A and FIG. 9B illustrate an example of the touch panel. FIG. 9A is a perspective view of a touch panel 4210. FIG. 9B is a schematic perspective view of the input apparatus 4200. Note that for clarity, only typical components are illustrated.

The touch panel 4210 has a structure in which a display apparatus and a sensor device that are separately formed are attached to each other.

The touch panel 4210 includes the input apparatus 4200 and the display apparatus, which are provided to overlap with each other.

The input apparatus 4200 includes a substrate 4263, an electrode 4227, an electrode 4228, a plurality of wirings 4237, a plurality of wirings 4238, and a plurality of wirings 4239. The electrode 4227 can be electrically connected to the wiring 4237 or the wiring 4239, for example. In addition, the electrode 4228 can be electrically connected to the wiring 4239. An FPC 4272*b* is electrically connected to each of the plurality of wirings 4237 and the plurality of wirings 4238. An IC 4273*b* can be provided for the FPC 4272*b*.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

Figure 10:
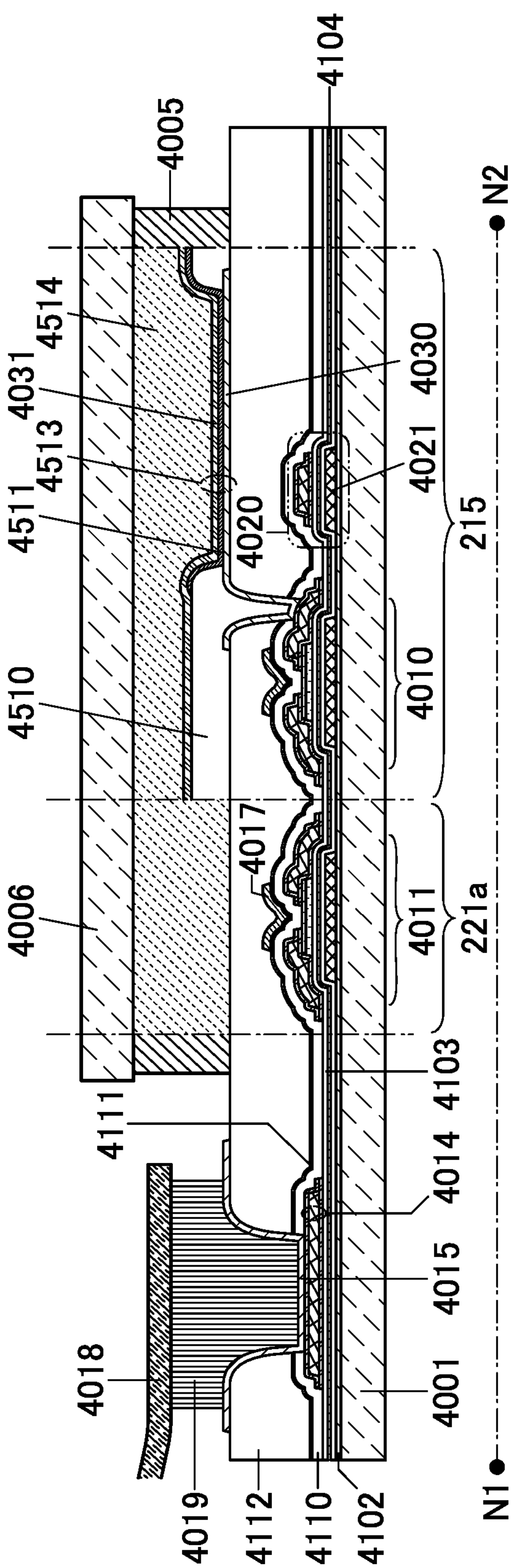
FIG. 10 is a diagram illustrating a display apparatus.

FIG. 10 is a cross-sectional view of a portion indicated by chain line N1-N2 in FIG. 8B. FIG. 10 illustrates an example of a display apparatus using a light-emitting device as the display device. The display apparatus includes an electrode 4015, and the electrode 4015 is electrically connected to a terminal included in the FPC 4018 through an anisotropic conductive layer 4019. In FIG. 10, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221*a* provided over the first substrate 4001 each include a plurality of transistors. The transistor 4010 included in the display portion 215 and the transistor 4011 included in the scan line driver circuit 221*a* are illustrated as an example. Note that in the example illustrated in FIG. 10, the transistor 4010 and the transistor 4011 are bottom-gate transistors but may be top-gate transistors.

The insulating layer 4112 is provided over the transistor 4010 and the transistor 4011. A partition wall 4510 is formed over the insulating layer 4112.

The partition wall 4510 is formed using an organic insulating material or an inorganic insulating material. It is particularly preferable that the partition wall 4510 be formed using a photosensitive resin material to have an opening over the first electrode layer 4030 such that a side surface of the opening slopes with continuous curvature.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display apparatus includes a capacitor 4020. The capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The display apparatus includes the insulating layer 4111 and an insulating layer 4104. For the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

The transistor 4010 provided in the display portion 215 is electrically connected to the display device. As the display device, a light-emitting device can be used. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device or an inorganic EL device can be used, for example. Note that an LED (including a micro LED), which uses a compound semiconductor as a light-emitting material, is an EL element, and can also be used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

A black matrix (a light-blocking layer); a coloring layer (a color filter); an optical member (an optical substrate) such as a polarizing member, a retardation member, or an anti-reflection member; or the like may be provided as appropriate if needed.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by, for example, an inkjet method or the like.

A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. In contrast, the latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

The first electrode layer and the second electrode layer (also called a pixel electrode layer, a common electrode layer, a counter electrode layer, or the like) for applying voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

This embodiment can be implemented in an appropriate combination with any of the structures described in the other embodiments.

Embodiment 3

In this embodiment, examples of transistors which can be used as the transistors described in the above embodiments are described with reference to drawings.

The display apparatus of one embodiment of the present invention can be manufactured using a transistor with any of various structures, such as a bottom-gate transistor or a top-gate transistor. Therefore, a material of a semiconductor layer and the structure of a transistor can be easily changed depending on the existing production line.

[Bottom-Gate Transistor]

Figure 11A:
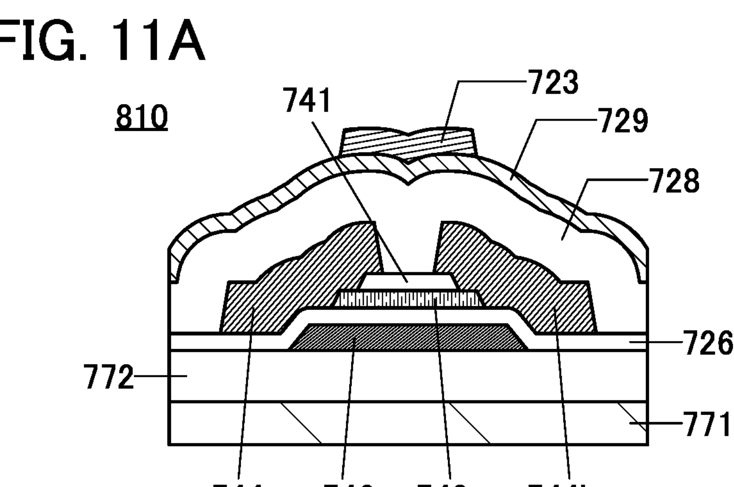
FIG. 11A to FIG. 11C are diagrams illustrating transistors.

FIG. 11A is a cross-sectional view of a channel-protective transistor 810, which is a type of bottom-gate transistor, in the channel length direction. In FIG. 11A, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744*a* and an electrode 744*b* are provided over the insulating layer 726 to be partly in contact with the semiconductor layer 742. The electrode 744*a* can function as one of a source electrode and a drain electrode. The electrode 744*b* can function as the other of the source electrode and the drain electrode. Part of the electrode 744*a* and part of the electrode 744*b* are formed over the insulating layer 741.

The insulating layer 741 can function as a channel protective layer. With the insulating layer 741 provided over the channel formation region, the semiconductor layer 742 can be prevented from being exposed at the time of forming the electrode 744*a* and the electrode 744*b*. Thus, the channel formation region in the semiconductor layer 742 can be prevented from being etched at the time of forming the electrode 744*a* and the electrode 744*b*.

The transistor 810 includes an insulating layer 728 over the electrode 744*a*, the electrode 744*b*, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744*a* and the electrode 744*b* which are in contact with the semiconductor layer 742. The carrier concentration in the regions of the semiconductor layer 742 where oxygen vacancies are generated is increased, so that the regions become n-type regions (n+ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744*a* and the electrode 744*b*. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744*a* and between the semiconductor layer 742 and the electrode 744*b*. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

An electrode 723 that can function as a back gate electrode is provided over the insulating layer 729. The electrode 723 can be formed using a material and a method similar to those for the electrode 746. Note that the electrode 723 does not have to be provided.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". In the transistor 810, for example, in the case where the electrode 723 is referred to as a "gate electrode", the electrode 746 is referred to as a "back gate electrode". In the case where the electrode 723 is used as a "gate electrode", the transistor 810 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 810 is increased and the field-effect mobility is increased.

Therefore, the transistor 810 is a transistor having a high on-state current for its occupation area. That is, the occupation area of the transistor 810 can be small for required on-state current.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

Figure 11B:
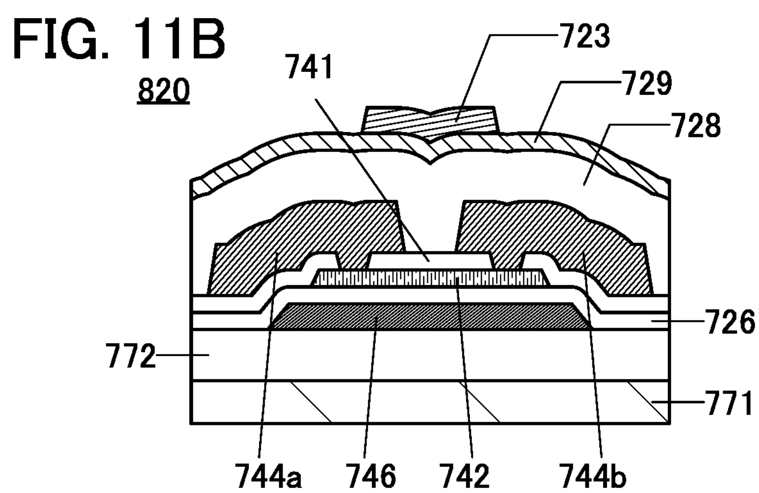

FIG. 11B is a cross-sectional view of a channel-protective transistor 820, which has a structure different from FIG. 11A, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744*a* through an opening formed by selectively removing part of the insulating layer 741 that overlaps with the semiconductor layer 742. The semiconductor layer 742 is electrically connected to the electrode 744*b* through another opening formed by selectively removing part of the insulating layer 741 that overlaps with the semiconductor layer 742. A region of the insulating layer 741 that overlaps with the channel formation region can function as a channel protective layer.

With the insulating layer 741, the semiconductor layer 742 can be prevented from being exposed at the time of forming the electrode 744*a* and the electrode 744*b*. Thus, the semiconductor layer 742 can be prevented from being reduced in thickness at the time of forming the electrode 744*a* and the electrode 744*b*.

The distance between the electrode 744*a* and the electrode 746 and the distance between the electrode 744*b* and the electrode 746 are longer in the transistor 820 than in the transistor 810. Thus, the parasitic capacitance generated between the electrode 744*a* and the electrode 746 can be reduced. Moreover, the parasitic capacitance generated between the electrode 744*b* and the electrode 746 can be reduced.

Figure 11C:
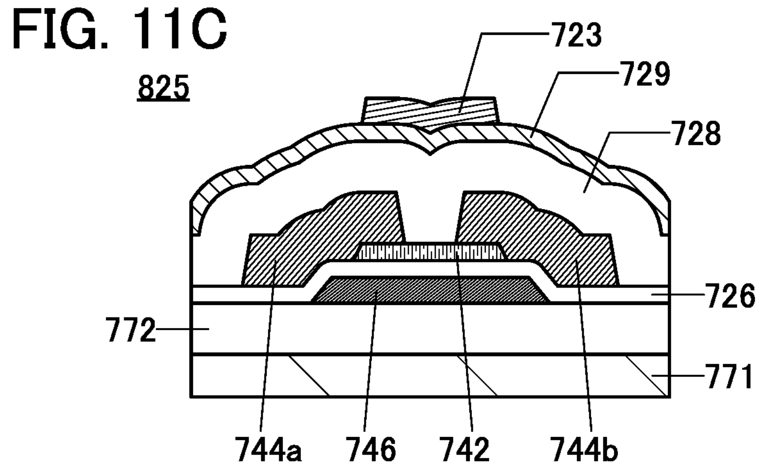

FIG. 11C is a cross-sectional view of a channel-etched transistor 825, which is a type of bottom-gate transistor, in the channel length direction. In the transistor 825, the electrode 744*a* and the electrode 744*b* are formed without the insulating layer 741. Thus, part of the semiconductor layer 742 that is exposed at the time of forming the electrode 744*a* and the electrode 744*b* might be etched. However, since the insulating layer 741 is not provided, the productivity of the transistor can be increased.

[Top-Gate Transistor]

Figure 12A:
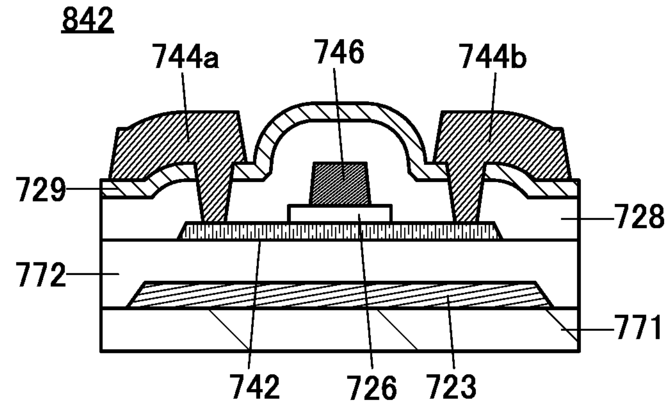
FIG. 12A to FIG. 12C are diagrams illustrating transistors.

A transistor 842 illustrated in FIG. 12A is a type of top-gate transistor. The electrode 744*a* and the electrode 744*b* are electrically connected to the semiconductor layer 742 through openings formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than that of the semiconductor layer 742 in a region into which the impurity is introduced not through the insulating layer 726. Thus, an LDD (Lightly Doped Drain) region is formed in a region of the semiconductor layer 742 which overlaps with the insulating layer 726 but does not overlap with the electrode 746.

The transistor 842 includes the electrode 723 that is formed over the substrate 771. The electrode 723 includes a region overlapped by the semiconductor layer 742 with the insulating layer 772 therebetween. The electrode 723 can function as a back gate electrode. Note that the electrode 723 does not have to be provided.

Figure 12B:
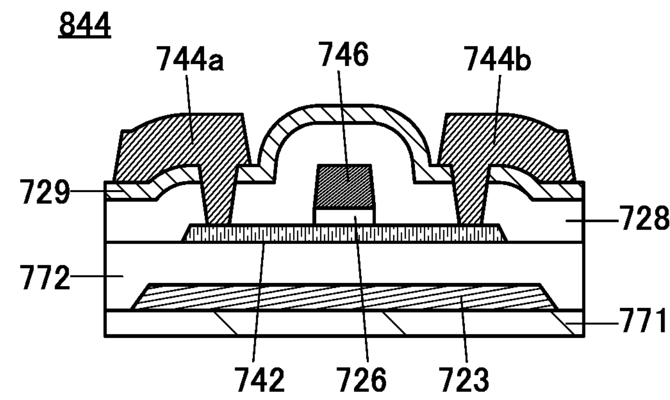
Figure 12C:
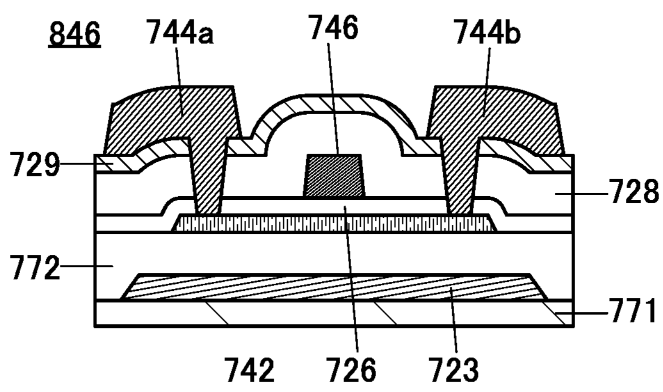

As in a transistor 844 illustrated in FIG. 12B, the insulating layer 726 in a region that does not overlap with the electrode 746 may be completely removed. Alternatively, the insulating layer 726 may be left as in a transistor 846 illustrated in FIG. 12C.

Figures 13A, 13B:
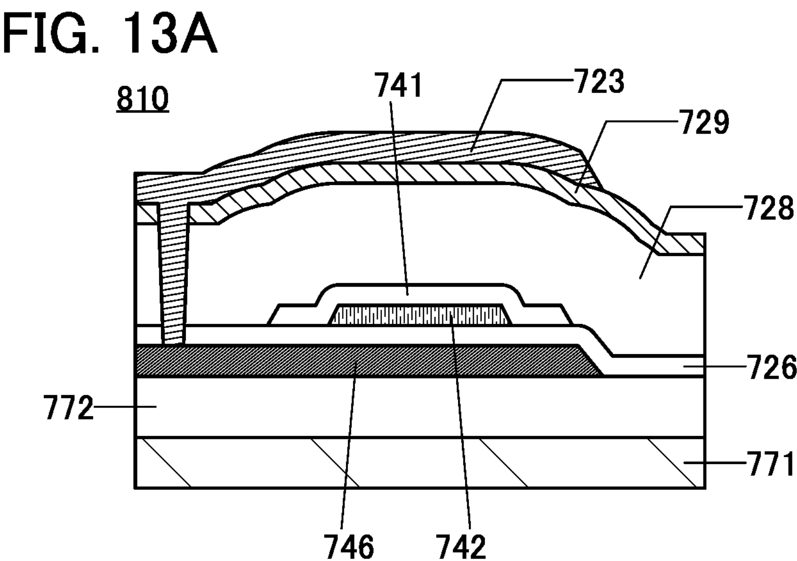
FIG. 13A and FIG. 13B are diagrams illustrating transistors.

FIG. 13A shows a cross-sectional view of the transistor 810 in the channel width direction, and FIG. 13B shows a cross-sectional view of the transistor 842 in the channel width direction.

In each of the structures shown in FIG. 13A and FIG. 13B, the gate electrode is connected to the back gate electrode, and the potentials of the gate electrode and the back gate electrode become equal to each other. In addition, the semiconductor layer 742 is positioned between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode or the back gate electrode with insulating layers positioned therebetween.

This structure enables the semiconductor layer 742 included in the transistor to be electrically surrounded by electric fields of the gate electrode and the back gate electrode.

The transistor device structure in which the semiconductor layer 742 in which the channel formation region is formed is electrically surrounded by electric fields of the gate electrode and the back gate electrode in this manner can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

Note that a configuration where the gate electrode and the back gate electrode are not connected to each other and are supplied with different potentials may be employed. For example, supplying a constant potential to the back gate electrode can control the threshold voltage of the transistor.

This embodiment can be implemented in an appropriate combination with any of the structures described in the other embodiments and Example.

Embodiment 4

Examples of an electronic device that can use the display apparatus of one embodiment of the present invention include display appliances, personal computers, image storage devices and image reproducing devices provided with storage media, mobile phones, game machines including portable game machines, portable data terminals, e-book readers, cameras such as video cameras and digital still cameras, goggles-type displays (head mounted displays), navigation systems, audio reproducing devices (e.g., car audio players and digital audio players), copiers, facsimiles, printers, multifunction printers, automated teller machines (ATM), and vending machines. FIG. 14A to FIG. 14F illustrate specific examples of such electronic devices.

Figure 14A:
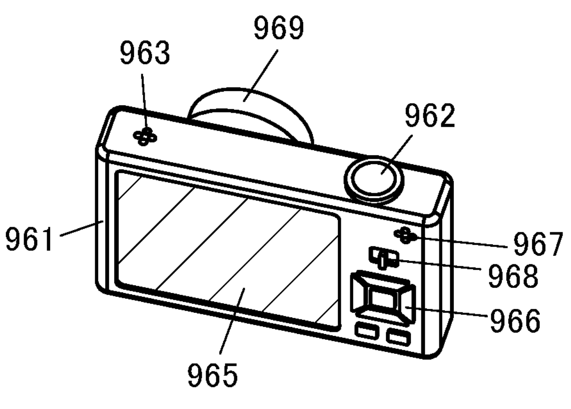
FIG. 14A to FIG. 14F are diagrams illustrating electronic devices.

FIG. 14A illustrates a digital camera, which includes a housing 961, a shutter button 962, a microphone 963, a speaker 967, a display portion 965, operation keys 966, a zoom lever 968, a lens 969, and the like. The display apparatus of one embodiment of the present invention can be used for the display portion 965.

Figure 14B:
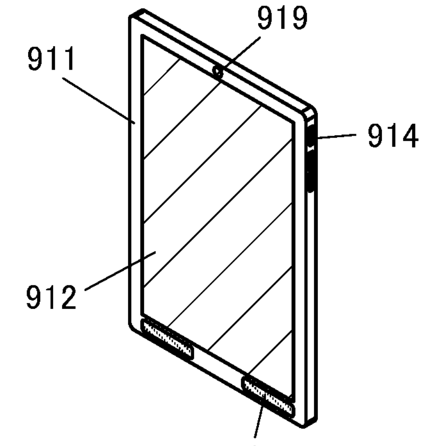

FIG. 14B illustrates a portable data terminal, which includes a housing 911, a display portion 912, speakers 913, an operation button 914, a camera 919, and the like. A touch panel function of the display portion 912 enables input and output of information. The display apparatus of one embodiment of the present invention can be used for the display portion 912.

Figure 14C:
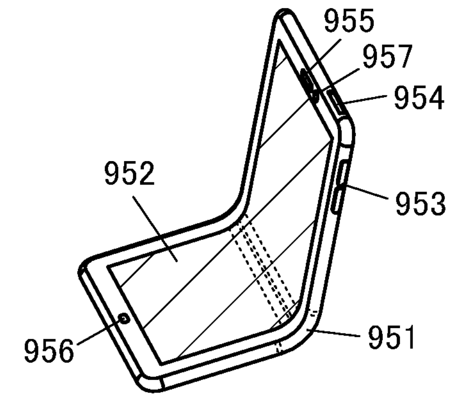

FIG. 14C illustrates a mobile phone, which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The housing 951 and the display portion 952 have flexibility and can be used in a bent state as illustrated in the diagram. The display apparatus of one embodiment of the present invention can be used for the display portion 952.

Figure 14D:
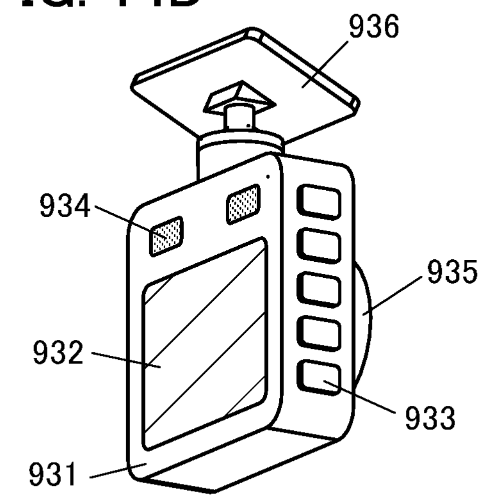

FIG. 14D illustrates a dashboard camera, which includes a housing 931, a display portion 932, an operation button 933, a microphone 934, a lens 935, a connection portion 936, and the like. The dashboard camera is mounted to the windshield or the like of the automobile by the connection portion 936 so that the dashboard camera can record the front view during the driving. The image being recorded can be displayed on the display portion 932. The display apparatus of one embodiment of the present invention can be used for the display portion 932.

Figure 14E:
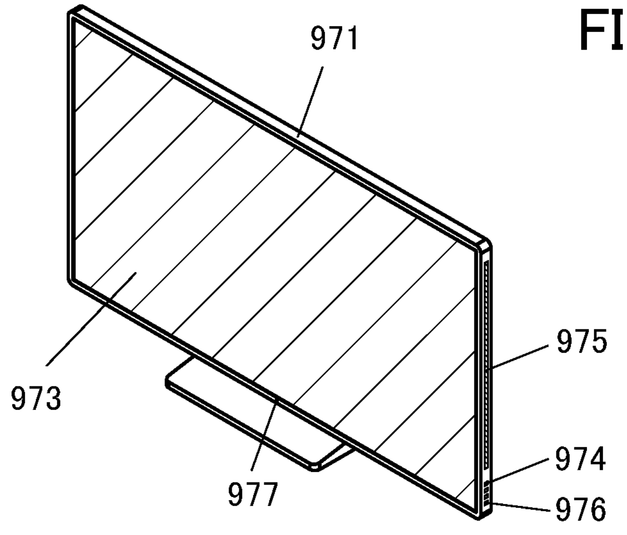

FIG. 14E illustrates a television, which includes a housing 971, a display portion 973, an operation button 974, speakers 975, a communication connection terminal 976, an optical sensor 977, and the like. The display portion 973 includes a touch sensor that enables an input operation. The display apparatus of one embodiment of the present invention can be used for the display portion 973.

Figure 14F:
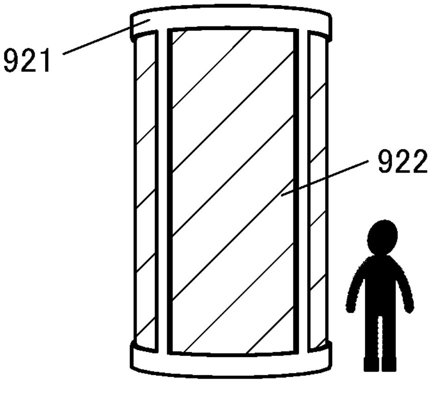

FIG. 14F illustrates digital signage, which includes a large display portion 922. The large display portion 922 in the digital signage is attached to a side surface of a pillar 921, for example. The display apparatus of one embodiment of the present invention can be used for the display portion 922.

This embodiment can be implemented in an appropriate combination with any of the structures described in the other embodiments.

REFERENCE NUMERALS

10: pixel, 11: pixel array, 20: source driver, 30: gate driver, 40: signal generator circuit, 40*a*: circuit, 40*b*: circuit, 41*a*: buffer circuit, 41*b*: buffer circuit, 42: CMOS inverter circuit, 43*n*: n-channel transistor, 43*p*: p-channel transistor, 45*a*: selection circuit, 45*b*: selection circuit, 46*a*: inverter circuit, 46*b*: inverter circuit, 47*a*: transistor, 47*b*: transistor, 48*a*: transistor, 48*b*: transistor, 101: transistor, 102: transistor, 103: transistor, 104: transistor, 105: transistor, 106: capacitor, 107: capacitor, 108: light-emitting device, 121: wiring, 122: wiring, 123: wiring, 124: wiring, 125: wiring, 126: wiring, 129: wiring, 215: display portion, 221*a*: scan line driver circuit, 231*a*: signal line driver circuit, 232*a*: signal line driver circuit, 241*a*: common line driver circuit, 301: transistor, 302: transistor, 303: transistor, 304: transistor, 305: transistor, 306: capacitor, 307: capacitor, 308: light-emitting device, 309: light-emitting device, 323: power supply line, 723: electrode, 726: insulating layer, 728: insulating layer, 729: insulating layer, 741: insulating layer, 742: semiconductor layer, 744*a*: electrode, 744*b*: electrode, 746: electrode, 771: substrate, 772: insulating layer, 810: transistor, 820: transistor, 825: transistor, 842: transistor, 844: transistor, 846: transistor, 911: housing, 912: display portion, 913: speaker, 914: operation button, 919: camera, 921: pillar, 922: display portion, 931: housing, 932: display portion, 933: operation button, 934: microphone, 935: lens, 936: portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: electrode layer, 4031: electrode layer, 4041: printed circuit board, 4042: integrated circuit, 4102: insulating layer, 4103: insulating layer, 4104: insulating layer, 4110: insulating layer, 4111: insulating layer, 4112: insulating layer, 4200: input apparatus, 4210: touch panel, 4227: electrode, 4228: electrode, 4237: wiring, 4238: wiring, 4239: wiring, 4263: substrate, 4272*b*: FPC, 4273*b*: IC, 4510: partition wall, 4511: light-emitting layer, 4513: light-emitting device, 4514: filler

The invention claimed is:

1. A display apparatus comprising:

a pixel comprising a first transistor, a second transistor, and a light-emitting device, wherein one of a source and a drain of the first transistor is electrically connected to one of a source and a drain of the second transistor, wherein a gate of the first transistor is electrically connected to a first source line, wherein the other of the source and the drain of the second transistor is electrically connected to one electrode of the light-emitting device, wherein a gate of the second transistor is electrically connected to a second source line, wherein the first transistor is a p-channel transistor, and wherein the second transistor is an n-channel transistor.

2. The display apparatus according to claim 1, wherein the first transistor comprises silicon in a channel formation region, wherein the second transistor comprises a metal oxide in a channel formation region, wherein the metal oxide comprises In, Zn, and M, and wherein M is Al, Ti, Ga, Ge, Sn, Y, Zr, La, Ce, Nd, or Hf.

3. The display apparatus according to claim 1, wherein the pixel comprises a third transistor, a fourth transistor, and a fifth transistor, wherein one of a source and a drain of the third transistor is electrically connected to a gate of the first transistor, wherein one of a source and a drain of the fourth transistor is electrically connected to a gate of the second transistor, and wherein one of a source and a drain of the fifth transistor is electrically connected to the other of the source and the drain of the second transistor.

4. The display apparatus according to claim 3, wherein the third transistor, the fourth transistor, and the fifth transistor comprise a metal oxide in channel formation regions, wherein the metal oxide comprises In, Zn, and M, and wherein M is Al, Ti, Ga, Ge, Sn, Y, Zr, La, Ce, Nd, or Hf.

5. The display apparatus according to claim 3, further comprising a first circuit, wherein the first circuit is configured to output a first data potential and a second data potential, wherein one of the first data potential and the second data potential is equivalent to an input potential to the first circuit, wherein the other of the first data potential and the second data potential is a potential obtained by binarizing the input potential, wherein the one of the first data potential and the second data potential is input to the gate of the first transistor through the third transistor, and wherein the other of the first data potential and the second data potential is input to the gate of the second transistor through the fourth transistor.

6. The display apparatus according to claim 5, wherein the first circuit comprises a CMOS inverter circuit which comprises a p-channel transistor containing silicon in a channel formation region and an n-channel transistor containing a metal oxide in a channel formation region, wherein the metal oxide comprises In, Zn, and M, and wherein M is Al, Ti, Ga, Ge, Sn, Y, Zr, La, Ce, Nd, or Hf.

7. An electronic device comprising the display apparatus according to claim 1 and a camera.

8. The display apparatus according to claim 1, further comprising a first circuit, wherein the first circuit is configured to output a first image data and a second image data, wherein the first image data is input to the gate of the first transistor through the first source line, and wherein the second image data is input to the gate of the second transistor through the second source line.

9. A display apparatus comprising:

a pixel comprising a first transistor, a second transistor, and a light-emitting device, wherein one of a source and a drain of the first transistor is electrically connected to one of a source and a drain of the second transistor, wherein a gate of the first transistor is electrically connected to a first source line, wherein the other of the source and the drain of the second transistor is electrically connected to one electrode of the light-emitting device, wherein a gate of the second transistor is electrically connected to a second source line, wherein the first transistor comprises a first semiconductor layer comprising a channel formation region, wherein the second transistor comprises a second semiconductor layer comprising a channel formation region, and wherein a material of the first semiconductor layer is different from a material of the second semiconductor layer.

10. The display apparatus according to claim 9, wherein the first semiconductor layer comprises silicon, and wherein the second semiconductor layer comprises a metal oxide.

11. The display apparatus according to claim 10, wherein the metal oxide comprises In, Zn, and M, and wherein M is Al, Ti, Ga, Ge, Sn, Y, Zr, La, Ce, Nd, or Hf.

12. The display apparatus according to claim 9, further comprising a first circuit, wherein the first circuit is configured to output a first image data and a second image data, wherein the first image data is input to the gate of the first transistor through the first source line, and wherein the second image data is input to the gate of the second transistor through the second source line.

13. A display apparatus comprising:

a pixel comprising a first transistor, a second transistor, a light-emitting device, and a first circuit, wherein one of a source and a drain of the first transistor is electrically connected to one of a source and a drain of the second transistor, wherein the other of the source and the drain of the second transistor is electrically connected to one electrode of the light-emitting device, wherein in a first period, the first transistor is configured to operate as a driving transistor, wherein in a second period, the second transistor is configured to operate as a driving transistor, wherein the first circuit is configured to output a first image data and a second image data, wherein the first image data is input to a gate of the first transistor, and wherein the second image data is input to a gate of the second transistor.

14. The display apparatus according to claim 13, wherein the first transistor comprises a first semiconductor layer comprising a channel formation region, wherein the second transistor comprises a second semiconductor layer comprising a channel formation region, and wherein a material of the first semiconductor layer is different from a material of the second semiconductor layer.

15. The display apparatus according to claim 14, wherein the first semiconductor layer comprises silicon, and wherein the second semiconductor layer comprises a metal oxide.

16. The display apparatus according to claim 15, wherein the metal oxide comprises In, Zn, and M, and wherein M is Al, Ti, Ga, Ge, Sn, Y, Zr, La, Ce, Nd, or Hf.

17. The display apparatus according to claim 13, wherein the first transistor is a p-channel transistor, and wherein the second transistor is an n-channel transistor.

* * * * *